(12) United States Patent
Wu et al.

(10) Patent No.: US 11,100,963 B1
(45) Date of Patent: Aug. 24, 2021

(54) DATA FIRST-IN FIRST-OUT (FIFO) CIRCUIT

(71) Applicant: ELITE SEMICONDUCTOR MICROELECTRONICS TECHNOLOGY INC., Hsinchu (TW)

(72) Inventors: Po-Hsun Wu, Hsinchu (TW); Jen-Shou Hsu, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 0 days.

(21) Appl. No.: 16/935,206

(22) Filed: Jul. 22, 2020

(51) Int. Cl.
  *G11C 7/10* (2006.01)
  *G11C 7/22* (2006.01)

(52) U.S. Cl.
  CPC .......... *G11C 7/1012* (2013.01); *G11C 7/1057* (2013.01); *G11C 7/1084* (2013.01); *G11C 7/22* (2013.01)

(58) Field of Classification Search
  CPC ... G11C 7/1012; G11C 7/1057; G11C 7/1084; G11C 7/22
  USPC .................................................. 365/189.05
  See application file for complete search history.

(56) References Cited

U.S. PATENT DOCUMENTS

| | | | |
|---|---|---|---|
| 6,067,267 A | 5/2000 | Lo | |
| 6,272,608 B1 | 8/2001 | Ryan et al. | |
| 2005/0080975 A1* | 4/2005 | Elledge | G06F 13/4027 710/316 |
| 2008/0022176 A1* | 1/2008 | Anzou | G11C 29/38 714/733 |

* cited by examiner

*Primary Examiner* — Huan Hoang (57) ABSTRACT

A data first-in first-out (FIFO) circuit includes a register unit, a plurality of data multiplexers, and an output multiplexer. The register unit includes a plurality of decoders and a plurality of N registers. The decoders are used for outputting a plurality of decoded signals in response to a plurality of corresponding input control signals and at least one input enabling signal. The N registers are configured to receive input data in response to the corresponding decoded signals from the corresponding decoders. The data multiplexers each are coupled to M ones of the registers, wherein N and M are positive integers, N is equal to or greater than four, M is equal to or greater than two, and N is greater than M. The output multiplexer, coupled to the data multiplexers, is used for providing a corresponding output from the data multiplexers sequentially.

15 Claims, 8 Drawing Sheets

DATA FIRST-IN FIRST-OUT (FIFO) CIRCUIT

BACKGROUND OF THE INVENTION

1. Field of the Invention

The present disclosure relates to a data first-in first-out (FIFO) circuit, and in particular to a data first-in first-out (FIFO) circuit for use in a memory device operable in a high-speed data-rate application.

2. Description of the Related Art

Data first-in first-out (FIFO) circuits can be used to temporarily store information for transfer between two different circuits operating at different clock rates. The FIFO circuits and their variations are universally employed in a variety of electronic applications, such as memory devices, storage devices, network devices, video storage applications, etc. In the memory device application, for example, a volatile memory module such as a double data rate (DDR) series (e.g., DDR2, DDR3, DDR4 etc.) synchronous dynamic random-access memory (SDRAM) which is indispensable to electronic devices such as personal computers, servers etc., requires input or output interfaces based on different FIFO circuits for data transfer between memory chips and the host. The input or output interfaces are employed for memory writing or reading operations and are typically realized based on FIFO circuits for data transfer, operating in a high-speed and reliable manner in order to meet the requirements of the memory interface specification.

Figure 1:
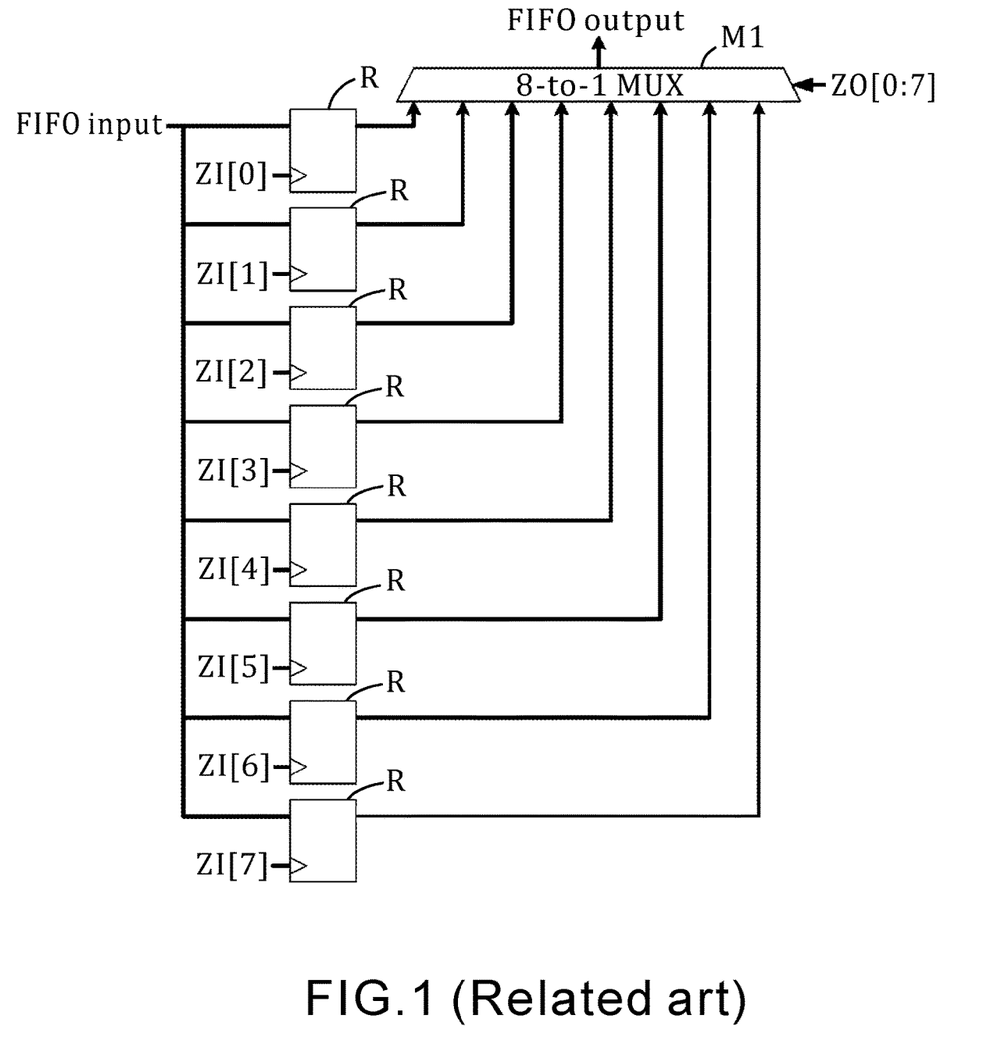
FIG. 1 (Related Art) is a schematic diagram illustrating a conventionally FIFO circuit in a memory chip of a memory system.

As a result, the structure and operation of a FIFO circuit are of concern with respect to the requirements of the memory interface specification. As an example in a DDR3 memory device, a delay time between a READ command and the time when data is available is 16 (i.e., Column Access Strobe (CAS) latency, or CL, equals 16 (clock cycles in units)). A conventional FIFO circuit, as shown in FIG. 1, can be employed as a building block of an output FIFO unit in the DDR3 memory device. In FIG. 1, the FIFO circuit includes eight registers, indicated by R, and an 8-to-1 multiplexer, indicated by M1. When read commands are processed by the memory module, the registers R can be controlled by using input control signals, indicated by ZI[0] to ZI[7] so that each register R stores respective 4-bit data from an FIFO input (e.g., 4-bit data each time) in a sequential manner. For meeting the requirement of the CL being 16, the 8-to-1 multiplexer M1 can be controlled by output control signals, indicated by ZO[0] to ZO[7], so as to sequentially output respective data provided by the registers R when the delay time of the CL for each of the read commands elapses.

As the memory technology advances, a new generation of memory systems will be operated at higher data rates. For example, a DDR4 SDRAM operates at a frequency between 800 and 1600 MHz (DDR4-1600 through DDR4-3200), compared to frequencies between 400 and 1067 MHz of DDR3 SDRAM. Because of a greater CL value for the DDR4 SDRAM, more FIFOs in the memory chip are required. A FIFO circuit (not shown) for DDR4 SDRAMs may be implemented by using the similar structure and operation of the FIFO circuit of FIG. 1. In this case, the FIFO circuit for DDR4 SDRAMs requires a 16-to-1 multiplexer instead of the 8-to-1 multiplexer M1 for outputting data of 4 bits from the registers sequentially, leading to the need of a greater number (e.g., 16) of output control signals than those for the FIFO circuit of FIG. 1. In addition, the number of input control signals for control of the registers depends on what data size of the registers (e.g., 4-bit or 8-bit) for receiving the FIFO input is taken. As such, the number of trace lines for the input control signals and output control signals inevitably increases circuit complexity of the FIFO circuit, which is a hindrance to the compactness of the FIFO circuit.

Further, the FIFO circuit for DDR4 SDRAMs may suffer from signal overload of the 16-to-1 multiplexer which is based on transmission gates. In the worst case, signal overload would cause the multiplexer to output false data or to transition signal levels at a lower slew rate, thus lowering the reliability of the memory module.

Accordingly, it is challenging to implement the FIFO circuit in memory devices, and particularly in higher data rate applications.

BRIEF SUMMARY OF THE INVENTION

An objective of the present disclosure is to provide a data first-in first-out (FIFO) circuit capable of facilitating memory device applications of higher data rate.

To achieve at least the above objective, the present disclosure provides a data first-in first-out (FIFO) circuit comprising a register unit, a plurality of data multiplexers, and an output multiplexer. The register unit includes a plurality of decoders and a plurality of N registers. The decoders are used for outputting a plurality of decoded signals in response to a plurality of corresponding input control signals and at least one input enabling signal. The N registers are configured to receive input data in response to the corresponding decoded signals from the corresponding decoders. The data multiplexers each are coupled to M ones of the registers, wherein N and M are positive integers, N is equal to or greater than four, M is equal to or greater than two, and N is greater than M. The output multiplexer, coupled to the data multiplexers, is used for providing a corresponding output from the data multiplexers sequentially.

In an embodiment, the N registers are configured to receive the input data sequentially in accordance with the corresponding decoded signals.

In an embodiment, each of the data multiplexers provides corresponding data to the output multiplexer in response to at least an output enabling signal and the output multiplexer provides the corresponding output from the data multiplexers in response to a plurality of corresponding output control signals.

In an embodiment, a first one of the data multiplexers is configured to receive a first portion of a corresponding output from a first register of the corresponding M ones.

In an embodiment, a second one of the data multiplexers is configured to receive a second portion of the corresponding output from the first register of the corresponding M ones.

In an embodiment, in response to at least one output enabling signal which indicates enabling of providing the corresponding output of the first register, the first and second ones of the data multiplexers provide the first portion and the second portion of the corresponding output respectively as two inputs to the output multiplexer.

In an embodiment, in response to a plurality of corresponding output control signals which indicate a selection of the first register, the output multiplexer provides the two inputs sequentially.

In an embodiment, the output multiplexer is a first output multiplexer and the data FIFO circuit further comprises a second output multiplexer, coupled to the first output multiplexer, for selectively outputting a portion of the data outputted by the first output multiplexer.

In an embodiment, M is equal to or greater than four and each of the data multiplexers is coupled to the M ones of the registers.

In an embodiment, the data multiplexers include a first multiplexer, a second multiplexer, a third multiplexer, and a fourth multiplexer. The first multiplexer is configured to receive a first portion of a corresponding output from a first register of the corresponding M ones. The second multiplexer is configured to receive a second portion of the corresponding output from the first register of the corresponding M ones. The third multiplexer is configured to receive a first portion of a corresponding output from a second register of the corresponding M ones. The fourth multiplexer is configured to receive a second portion of the corresponding output from the second register of the corresponding M ones. The output multiplexer is configured to receive outputs from the data multiplexers and outputting data from one of the data multiplexers sequentially.

In an embodiment, in response to at least one output enabling signal which indicates enabling of providing the corresponding outputs of the first and second registers, the first to fourth multiplexers provide the first portion and the second portion of the corresponding output from the first register and the first portion and the second portion of the corresponding output from the second register, respectively, as inputs to the output multiplexer.

In an embodiment, in response to a plurality of corresponding output control signals which indicate a selection of the first and second registers, the output multiplexer provides the inputs sequentially.

In an embodiment, the first multiplexer is further configured to receive a first portion of a corresponding output from a third register of the corresponding M ones; the second multiplexer is further configured to receive a second portion of the corresponding output from the third register of the corresponding M ones; the third multiplexer is further configured to receive a first portion of a corresponding output from a fourth register of the corresponding M ones; the fourth multiplexer is further configured to receive a second portion of the corresponding output from the fourth register of the corresponding M ones, wherein the output multiplexer is configured to receive outputs from the data multiplexers and outputting data from one of the data multiplexers sequentially.

In an embodiment, in response to at least one output enabling signal which indicates enabling of providing the corresponding outputs of the third and fourth registers, the first to fourth multiplexers provide the first portion and the second portion of the corresponding output from the third register and the first portion and the second portion of the corresponding output from the fourth register, respectively, as inputs to the output multiplexer.

In an embodiment, in response to a plurality of corresponding output control signals which indicate a selection of the third and fourth registers, the output multiplexer provides the inputs sequentially.

DETAILED DESCRIPTION OF THE INVENTION

To facilitate understanding of the object, characteristics and effects of this present disclosure, embodiments together with the attached drawings for the detailed description of the present disclosure are provided.

Embodiments of a data first-in first-out (FIFO) circuit will be provided, which are capable of facilitating memory device applications of higher data rate. As will be shown below, the data FIFO circuit can facilitate reduced circuit complexity and increase reliability of a memory device.

Figure 2:
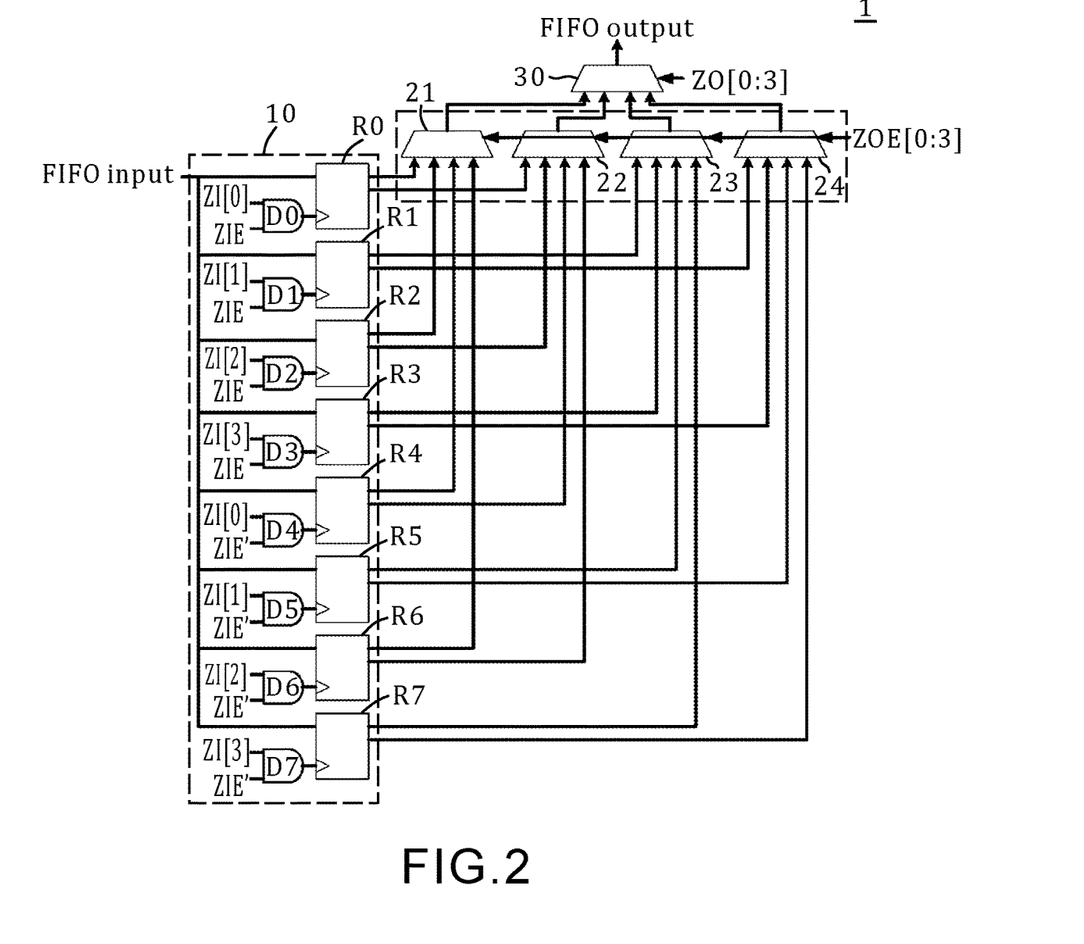
FIG. 2 is a block diagram illustrating a data FIFO circuit according to an embodiment of the present disclosure.

Referring to FIG. 2, a data FIFO circuit is illustrated according to an embodiment of the present disclosure in block form. As shown in FIG. 2, a data first-in first-out (FIFO) circuit 1 includes a register unit 10, a plurality of data multiplexers (e.g., indicated by 21-24), and an output multiplexer 30.

The register unit 10 includes a plurality of decoders (e.g., indicated by D0-D7) and a plurality of N registers (e.g., R0-R7). The decoders (e.g., D0-D7) are used for outputting a plurality of decoded signals in response to a plurality of corresponding input control signals (e.g., ZI[0] to ZI[3]) and at least one input enabling signal (e.g., ZIE or ZIE'). The N (e.g., 8) registers (e.g., R0-R7) are configured to receive input data in response to the corresponding decoded signals from the corresponding decoders (e.g., D0-D7).

The data multiplexers (e.g., indicated by 21-24) each are coupled to M (e.g., 4) ones of the registers, wherein N and M are positive integers. In the embodiment shown in FIGS. 2, N and M are taken as 8 and 4. Certainly, the implementation of the present disclosure is not limited to the examples. In some embodiments, the data FIFO circuit can be implemented based on FIG. 2 so that N is equal to or greater than four, M is equal to or greater than two, and N is greater than M. For example, using the structure of the data FIFO circuit 1, a data FIFO circuit with the number of registers of the register unit set to four and the number of data multiplexers set to two can be implemented.

The output multiplexer 30, coupled to the data multiplexers (e.g., 21-24), is used for providing a corresponding output from the data multiplexers sequentially.

The data FIFO circuit 1 of FIG. 2 is capable of facilitating memory device applications of higher data rate. In a practical application of the data FIFO circuit 1 in a DDR4 SDRAM, for example, the data FIFO circuit 1 can facilitate reduced circuit complexity by using the decoders in the register unit 10 so that reduced number of input control signals can be employed to control the register unit 10. In addition, the data FIFO circuit 1 utilizes the structure of at least two stages of data multiplexing (e.g., the data multiplexers taken as a first stage and the output multiplexer as a second stage) for data output so that the loading of the output multiplexer can be mitigated, thus facilitating reliability of a memory device using the data FIFO circuit 1.

The following provides various embodiments of the register unit, the data multiplexers, and the output multiplexer.

In an embodiment, the N registers (e.g., R0-R7) can be configured to receive the input data (e.g., each piece of 8-bit data) sequentially in accordance with the corresponding decoded signals outputted by the decoders (e.g., D0-D7). In some examples, the decoders (e.g., D0-D7) can be implemented by corresponding logic circuits or components. Referring to FIG. 2, each of the decoders D0-D3 can be realized by using an AND gate having two inputs (e.g., ZI[0] and ZIE for the decoder D0) or equivalent logic circuit or components, and the corresponding decoded signal is the logic operation of the two inputs. Each of the decoders D4-D7 can be realized by using an AND gate having two inputs (e.g., ZI[0] and ZIE' for the decoder D4) or equivalent logic circuit or components and the corresponding decoded signal is the result of the AND operation of the two inputs. In this manner, the use of decoders with the registers in the data FIFO circuit 1 facilitates the implementation of data input with a reduced number of input control signals, as compared to those of the conventional data FIFO circuit of FIG. 1. In addition, the registers may be implemented by any appropriate circuits, such as flip-flops, etc. Certainly, the implementation of the present disclosure is not limited to the examples.

In an embodiment, each of the data multiplexers (e.g., 21-24) provides corresponding data to the output multiplexer 30 in response to at least an output enabling signal (e.g., ZOE[0:3]) and the output multiplexer 30 provides the corresponding output from the data multiplexers (e.g., 21-24) in response to a plurality of corresponding output control signals (e.g., ZO[0:3]).

Figure 3:
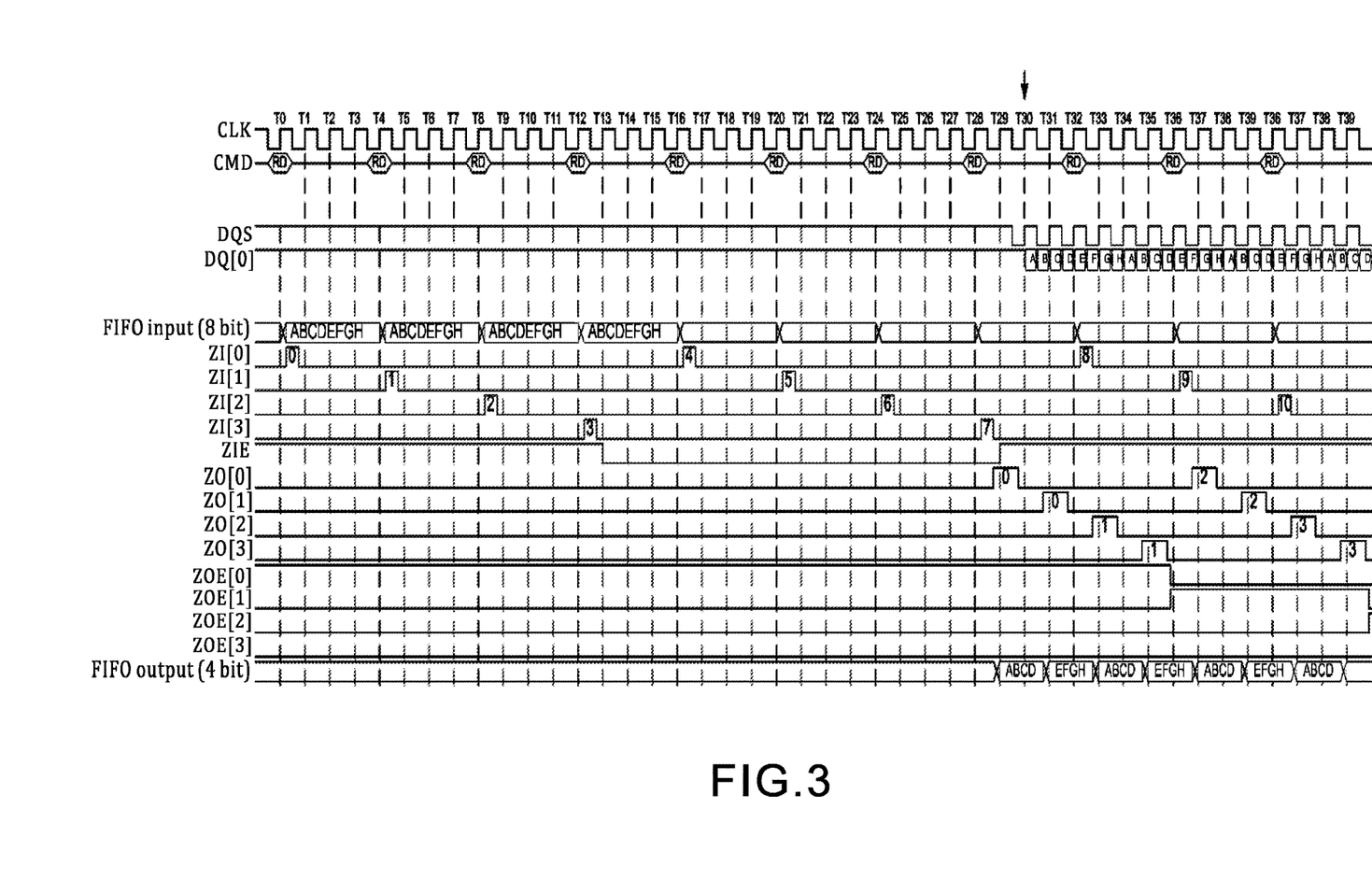
FIG. 3 is a schematic timing diagram illustrating operation of the data FIFO circuit of FIG. 2 according to an embodiment of the present disclosure.
Figure 6:
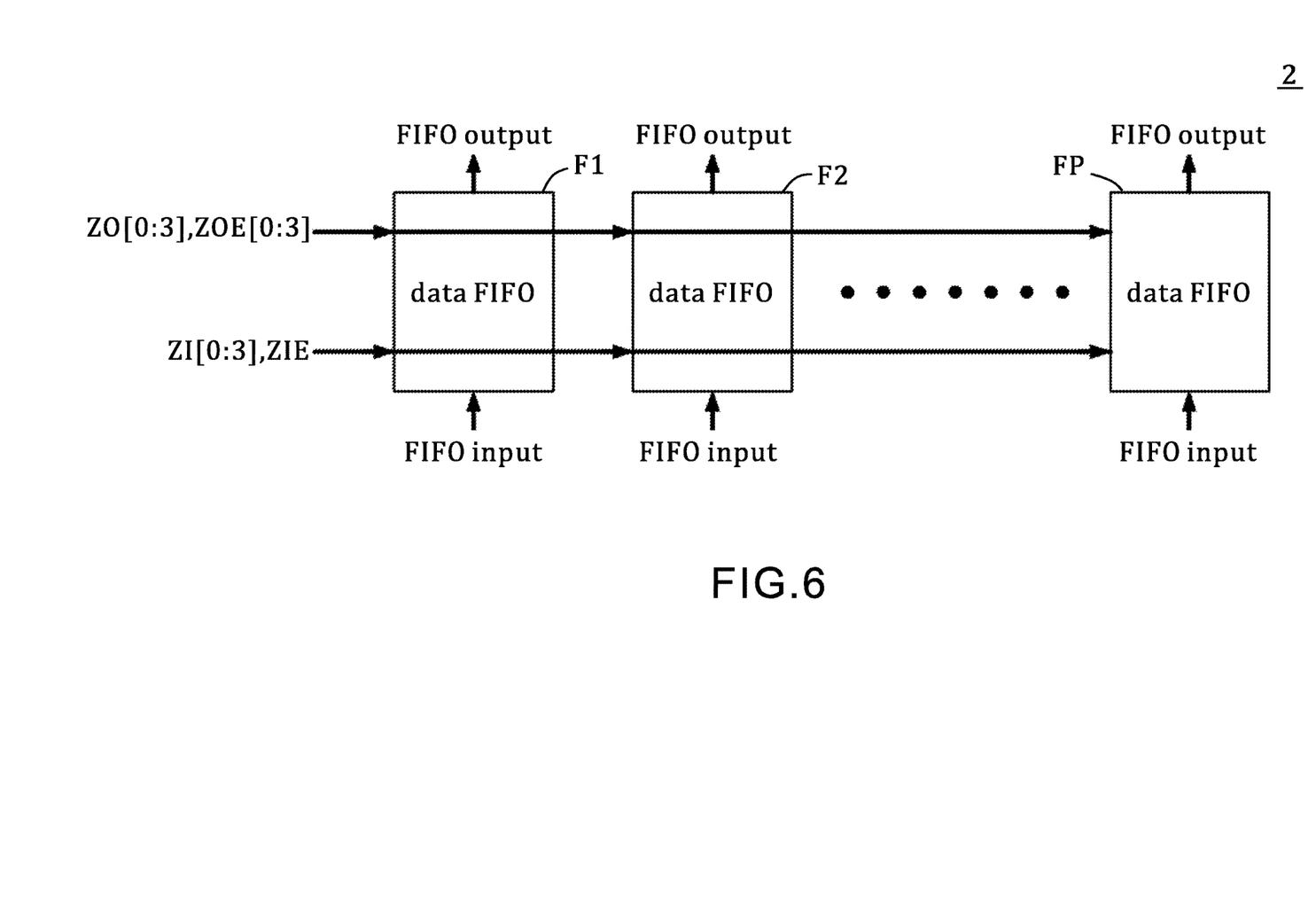
FIG. 6 is a schematic diagram illustrating an embodiment of a data FIFO unit based on the data FIFO circuit as shown in FIG. 2 for memory devices.

In an embodiment, the data FIFO circuit 1 of FIG. 2 can be employed as a building block of an output FIFO unit, as exemplified in FIG. 6, of a DDR4 memory device. Referring to FIG. 3, a schematic timing diagram illustrates operation of the data FIFO circuit 1 of FIG. 2 according to an embodiment of the present disclosure. The following illustrates the FIFO operations under the requirement of a Column Access Strobe (CAS) latency, or CL, equals 30 (clock cycles in units)), for example. As shown in FIG. 3, when read commands (e.g., indicated by RD in a waveform indicated by CMD) are processed by the memory device with respect to a clock signal (e.g., indicated by CLK), the registers R0-R7 can be controlled by using the input control signals, indicated by ZI[0] to ZI[3], and the input enabling signal, indicated by ZIE (or ZIE'), so that each register stores respective 8-bit data from an FIFO input (e.g., each piece of 8-bit data indicated by "ABCDEFGH" in FIG. 3) in a sequential manner. For example, when the input control signal ZI[0] and the input enabling signal ZIE are both asserted (e.g., positively enabled), as represented by a pulse of the input control signal ZI[0] indicated by "0" and by a high level of the input enabling signal ZIE, a corresponding piece of 8-bit data can be received by the register R0. Likewise, three pieces of 8-bit data can be received by the registers R1-R3, respectively, when the input enabling signal ZIE and one of the input control signals ZI[1]-ZI[3] are asserted.

When the input control signal ZI[0] is asserted and the input enabling signal ZIE is de-asserted (or ZIE' is asserted), as represented by a pulse of the input control signal ZI[0] indicated by "4" and by a low level of the input enabling signal ZIE, a corresponding piece of 8-bit data can be received by the register R4. Likewise, three pieces of 8-bit data can be received by the registers R4-R7, respectively, when the input enabling signal ZIE is de-asserted and one of the input control signals ZI[1]-ZI[3] is asserted.

As shown in FIG. 3, for meeting the requirement of the CL=30 and AL=0, the data multiplexers (e.g., 21-24) can be controlled by the output enabling signal and the output control signals in a sequential manner so as to ensure that data can be outputted when the delay time of the CL for the corresponding read command elapses. For example, when the output enabling signal ZOE[0] is asserted and one of the output control signals ZO[0]-ZO[3] is asserted sequentially (as indicated by the pulses of the output control signals ZO[0]-ZO[3] with "0" and "1" in FIG. 3), respective data from the registers R0-R1 are sequentially outputted via the output multiplexer 30. When the output enabling signal ZOE[1] is asserted and one of the output control signals ZO[0]-ZO[3] is asserted sequentially (as indicated by the pulses of the output control signals ZO[0]-ZO[3] with "2" and "3" in FIG. 3), the corresponding data from the registers R2-R3 are sequentially outputted via the output multiplexer 30. The operations for outputting of the corresponding data from the registers R4-R5, R6-R7 can then be performed similarly and will not be detailed for the sake of brevity. When the respective data from the registers are sequentially outputted via the output multiplexer 30, a memory device (e.g., a DDR4 SDRAM), which employs the data FIFO circuit 1, can output the data in the manner in accordance with the requirements of the memory data interface (e.g., DDR4), for example, in accordance with timing of a data strobe signal, indicated by DQS, and a data signal, indicated by DQ (such as, for DQ[0]), as illustrated in FIG. 3. Certainly, the implementation of the present disclosure is not limited to the above examples.

As illustrated above, utilizing the structure of at least two stages of data multiplexing for data output can mitigate the loading of the output multiplexer 30 and also lead to a reduced gate delay. In this regard, it is noted that during the output enabling signal ZOE[0] being asserted, for example, the data multiplexers 21-24 can output the corresponding data from the registers R0-R1 so that once the output control signals ZO[0]-ZO[3] is asserted sequentially, the output multiplexer 30 can output the corresponding data with reduced gate delay. By contrast, if the data multiplexers 21-24 and output multiplexer 30 are replaced by a 16-to-1 multiplexer as in the similar structure of the data FIFO circuit of FIG. 1, the 16-to-1 multiplexer which is based on logic gates may suffer from gate delays due to multiple cascaded logic gates of the 16-to-1 multiplexer. Accordingly, the data FIFO circuit 1 is capable of facilitating reliability of a memory device using the data FIFO circuit 1.

In an embodiment, a first one (e.g., data multiplexer 21 or 23) of the data multiplexers is configured to receive a first portion (e.g., first 4-bit data of 8-bit data) of a corresponding output from a first register (e.g., register R0 or R1) of the corresponding M (e.g., 2 or more) ones of the registers. Referring to FIG. 2, for example, the data multiplexer 21 is coupled to registers R0, R2, R4, R6 (e.g., for M=4) of the registers R0-R7 to receive the respective first portions. The data multiplexer 23, for example, is coupled to registers R1, R3, R5, R7 (e.g., for M=4) of the registers R0-R7 to receive the respective first portions.

In an embodiment, a second one (e.g., data multiplexer 22 or 24) of the data multiplexers is configured to receive a second portion (e.g., second 4-bit data of the 8-bit data) of the corresponding output from the first register (e.g., register R0 or R1) of the corresponding M ones of the registers. Referring to FIG. 2, for example, the data multiplexer 22 is coupled to registers R0, R2, R4, R6 (e.g., for M=4) of the registers R0-R7 to receive the respective second portions. The data multiplexer 24, for example, is coupled to registers R1, R3, R5, R7 (e.g., for M=4) of the registers R0-R7 to receive the respective second portions.

In an embodiment, in response to at least one output enabling signal (e.g., one of ZOE[0], ZOE[1], ZOE[2], ZOE[3] being asserted) which indicates enabling of providing the corresponding output of the first register (e.g., one of registers R0-R3; or one of registers R4-R7), the first and second ones (e.g., data multiplexers 21, 22; or 23, 24) of the data multiplexers provide the first portion and the second portion of the corresponding output respectively as two inputs to the output multiplexer 30. For example, referring to FIGS. 2 and 3, when the output enabling signal ZOE[0] is asserted, the first and second ones (e.g., data multiplexers 21, 22; or 23, 24) of the data multiplexers provide the first portion (e.g., the first 4-bit data of 8-bit data) and the second portion (e.g., the second 4-bit data of 8-bit data) of the corresponding output from the first register (e.g., register R0 or R1) respectively as two inputs to the output multiplexer 30. The above embodiment also can work for other registers similarly whenever appropriate and will not be repeated for the sake of brevity.

In an embodiment, in response to a plurality of corresponding output control signals which indicate a selection of the first register, the output multiplexer 30 provides the two inputs sequentially. For example, referring to FIGS. 2 and 3, when the output control signals ZO[0] and ZO[1] (represented by the corresponding pulses indicated by "0" in FIG. 3) indicate a selection of the register R0 (or R1, R2, R3), the output multiplexer 30 provides the two inputs (e.g., indicated by "ABCD" and "EFGH" for FIFO output in FIG. 3) sequentially.

In the above embodiments, the first and second portions can be provided at the same time via the first and second ones (e.g., data multiplexers 21, 22; or 23, 24) of the data multiplexers when the corresponding output enabling signal being asserted so that the output multiplexer 30 can output the first and second portions in a portion by portion and sequential manner, avoiding gate delay due to cascaded logic gates in a 16-to-1 multiplexer. Accordingly, the structure of at least two stages of data multiplexing for data output makes the data FIFO circuit suitable for being used in memory device applications of higher data rate. Certainly, the implementation of the present disclosure is not limited to the examples.

In an embodiment, M is equal to or greater than four and each of the data multiplexers is coupled to the M ones of the registers.

In an embodiment, the data multiplexer 21 is configured to receive a first portion of a corresponding output from the register R0 (or R2, R4, R6). The data multiplexer 22 is configured to receive a second portion of the corresponding output from the register R0 (or R2). The data multiplexer 23 is configured to receive a first portion of a corresponding output from the register R1 (or R3). The data multiplexer 24 is configured to receive a second portion of the corresponding output from the register R1 (or R3). The output multiplexer 30 is configured to receive outputs from the data multiplexers 21-24 and outputting data from one of the data multiplexers 21-24 sequentially.

In an embodiment, in response to at least one output enabling signal (e.g., when one of ZOE[0]-ZOE[3] being asserted) which indicates enabling of providing the corresponding outputs of the first and second registers (e.g., registers R0, R1; R2, R3; R4, R5; R6, R7), the data multiplexers 21-24 provide the first portion and the second portion of the corresponding output from the first register (e.g. register R0, R2, R4, or R6) and the first portion and the second portion of the corresponding output from the second register (e.g., register R1, R3, R5, or R7), respectively, as inputs to the output multiplexer 30.

In an embodiment, in response to a plurality of corresponding output control signals (e.g., ZO[0] to ZO[3]) which indicate a selection of the first and second registers (e.g., registers R0, R1; R2, R3; R4, R5; R6, R7), the output multiplexer 30 provides the inputs sequentially.

In an embodiment, the data multiplexer 21 is further configured to receive a first portion of a corresponding output from a third register (e.g., R4 or R6); the data multiplexer 22 is further configured to receive a second portion of the corresponding output from the third register (e.g., R4 or R6); the data multiplexer 23 is further configured to receive a first portion of a corresponding output from a fourth register (e.g., R5 or R7); the data multiplexer 24 is further configured to receive a second portion of the corresponding output from the fourth register (e.g., R5 or R7), wherein the output multiplexer 30 is configured to receive outputs from the data multiplexers 21-24 and outputting data from one of the data multiplexers 21-24 sequentially.

In an embodiment, in response to at least one output enabling signal (e.g., when one of ZOE[1]-ZOE[3] being asserted) which indicates enabling of providing the corresponding outputs of the third and fourth registers (e.g., registers R2, R3; R4, R5; R6, R7), the data multiplexers 21-24 provide the first portion and the second portion of the corresponding output from the third register (e.g. register R2, R4, or R6) and the first portion and the second portion of the corresponding output from the fourth register (e.g., register R3, R5, or R7), respectively, as inputs to the output multiplexer 30.

In an embodiment, in response to a plurality of corresponding output control signals (e.g., ZO[0] to ZO[3]) which indicate a selection of the third and fourth registers (e.g., registers R2, R3; R4, R5; R6, R7), the output multiplexer 30 provides the inputs sequentially.

In the above embodiments, the first and second portions of outputs from a pair of registers (e.g., registers R0, R1; R2, R3; R4, R5; R6, R7) can be provided at the same time via the first to fourth ones (e.g., data multiplexers 21, 22, 23, 24) of the data multiplexers when the corresponding output enabling signal being asserted so that the output multiplexer 30 can output the first and second portions of the outputs from the pair of registers in a portion by portion and sequential manner, avoiding gate delays due to cascaded logic gates in a 16-to-1 multiplexer. Accordingly, the structure of at least two stages of data multiplexing for data output makes the data FIFO circuit suitable for being used in memory device applications of higher data rate.

Figure 4:
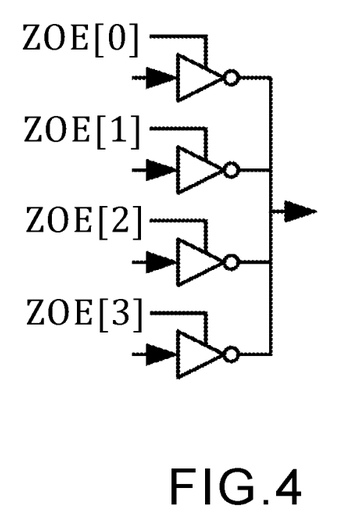
FIG. 4 is a schematic diagram illustrating an embodiment of a data multiplexer of FIG. 2.
Figure 5:
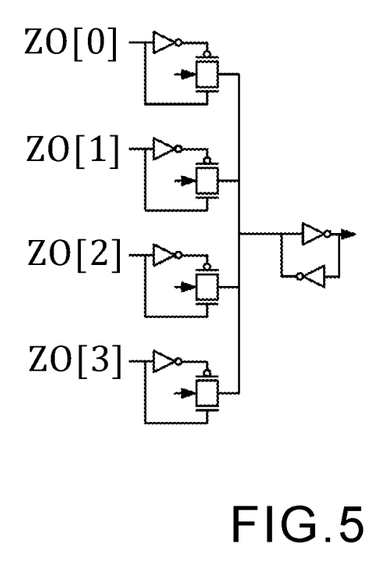
FIG. 5 is a schematic diagram illustrating an embodiment of an output multiplexer of FIG. 2.

Further, examples for implementation of the data multiplexers and output multiplexer are provided. FIG. 4 illustrates an embodiment of a data multiplexer of FIG. 2 in schematic form. The data multiplexers 21-24 in FIG. 2 each can be implemented based on that of FIG. 4. FIG. 5 shows an embodiment of an output multiplexer of FIG. 2 in schematic form. The output multiplexer 30 can be implemented based on that of FIG. 5, which uses transmission gates. Certainly, the implementation of the present disclosure is not limited to the examples.

In some embodiments, the data FIFO circuit based on FIG. 2 can be employed as a building block of an output FIFO unit, as exemplified in FIG. 6, of a DDR-series (e.g., DDR4, DDR5, etc.) memory device. As shown in FIG. 6, a data FIFO unit 2 includes a plurality of data FIFO circuits, indicated by F1, F2 to FP, where P is an integer greater than two. In a practical application for DDR-series memory devices, such as DDR4, the data FIFO unit 2 can be realized to include the data FIFO circuits F1 to FP, where P is equal to 16, for example. In this case, the FIFO input is 8-bit data each time and the FIFO output is 4-bit data each time. When the respective data from the registers are sequentially outputted via the data FIFO circuits F1 to FP, the memory device (e.g., a DDR4 SDRAM) can output the data in the manner in accordance with the requirements of the memory data interface (e.g., DDR4), for example, in accordance with timing of a data strobe signal, indicated by DQS, and a data signal, indicated by DQ (such as, for DQ[0]-DQ[P−1]).

In the embodiment as shown in FIG. 6, the number of control signals for controlling 16 data FIFO circuits is reduced, wherein 5 control signals (including four input control signals ZI[0:3] and one input enabling signal ZIE) are used for FIFO input control and 8 control signals (including four output control signals ZO[0:3] and four output enabling signals ZOE[0:3] are used for FIFO output control. In this manner, the number of trace lines for the control signals and output control signals can be significantly reduced, leading to reduced complexity of the data FIFO unit 2 and facilitating the saving of circuit layout area of and the compactness of the memory device using the data FIFO unit 2. The control signals, for example, can be implemented and generated by a memory control of the memory device (or module).

In the above embodiments, the application of the data FIFO circuit to DDR4 SDRAM is exemplified. However, the implementation of the present disclosure is not limited thereto. The structure and operation of the data FIFO circuit 1 can be applied to the FIFO structure of other or new generation of DDR memory interface technology or any electronic device which employs data FIFO circuits.

Figure 7:
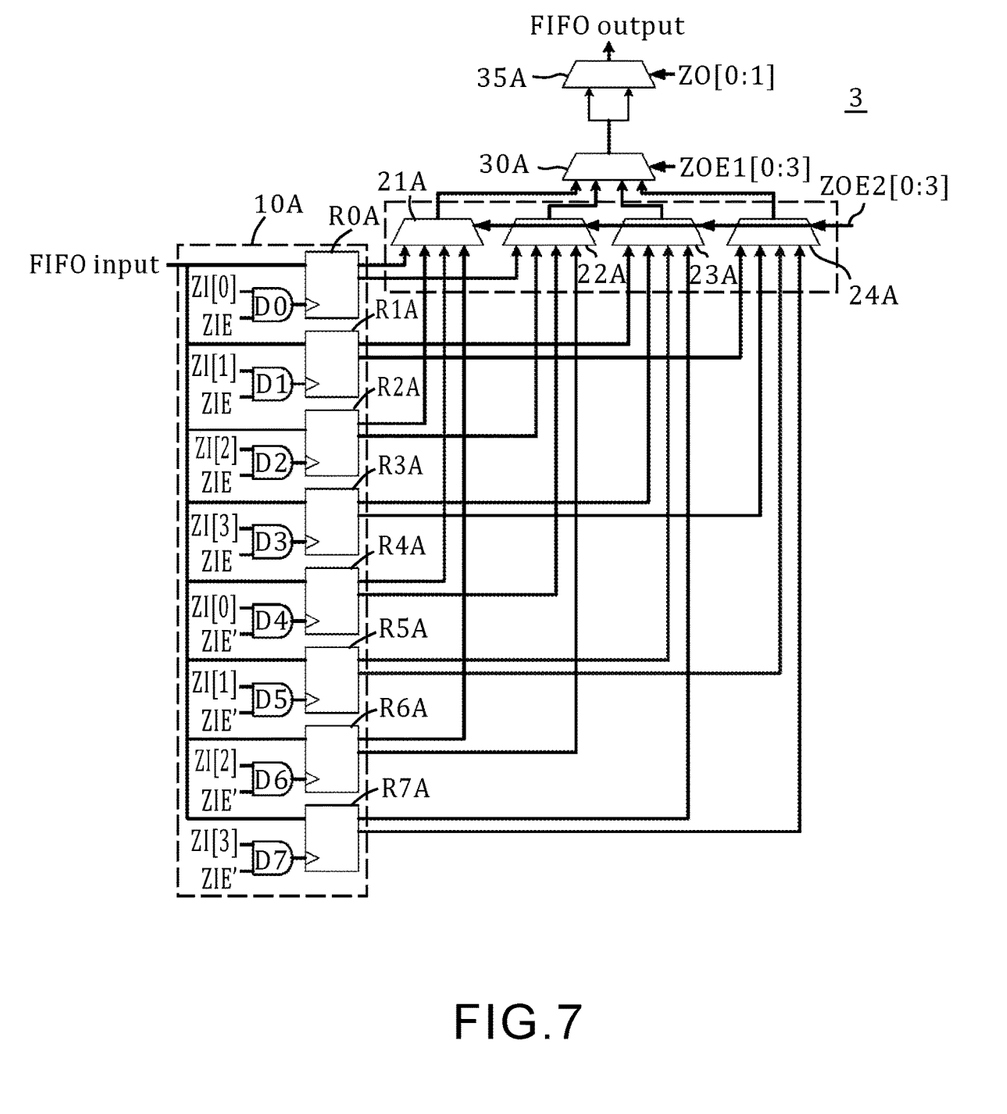
FIG. 7 is a block diagram illustrating a data FIFO circuit according to another embodiment of the present disclosure.

Referring to FIG. 7, a data FIFO circuit is illustrated according to another embodiment of the present disclosure in block form. The data FIFO circuit 3 based on FIG. 7, for example, can be employed as a building block of an output FIFO unit, in a manner similar to that of FIG. 6, for a DDR5 memory device. As shown in FIG. 7, a data FIFO circuit 3 includes a register unit 10A, a plurality of data multiplexers (e.g., indicated by 21A-24A), and output multiplexers 30A, 35A. The data FIFO circuit 3 in this embodiment and the data FIFO circuit 1 of FIG. 2 differ mainly in that the data FIFO circuit 3 further includes the output multiplexer 35A, coupled to the output multiplexer 30A, for selectively outputting a portion of data outputted by the output multiplexer 30A. In addition, the output multiplexers 35A can be controlled by two output control signals ZO[0:1]. In a practical application of the data FIFO circuit 3 for DDR5 SDRAM, the FIFO input is 16-bit data each time and the FIFO output is 4-bit data each time, and 10 control signals (including two output control signals ZO[0:1], four output control signals ZOE1[0:3] and four output enabling signals ZOE2[0:3]) may be used for FIFO output control. By contrast, the conventional approach based on the data FIFO circuit structure as shown in FIG. 1 requires a 32-to-1 multiplexer for outputting 4-bit data each time from 8 16-bit data sequentially, leading to 32 control signals for FIFO output control. The 32-to-1 multiplexer would probably be inappropriate in the higher data rate application because of suffering from signal overload or gate delay issues.

The structure and operation of the data FIFO circuit 3 are exemplified as below. The register unit 10A can be implemented based on the register unit 10 in a similar manner except that registers R0A-R7A of the register unit 10A is configured to store 16-bit data since the FIFO input is of 16-bit data for each time. Decoders R0A-R7A can be implemented in a similar manner to those of the data FIFO circuit 1 of FIG. 2.

Regarding the multiplexers, in an embodiment, the data multiplexers 21A-24A and the output multiplexer 30A may be implemented by 8-bit 4-to-1 data multiplexers. For example, the 8-bit 4-to-1 data multiplexer may be formed based on that of FIG. 4. The output multiplexer 35A may be implemented by 4-bit 2-to-1 data multiplexers. For example, the 4-bit 2-to-1 data multiplexer may be formed based on transmission gates similar to that of FIG. 5. Certainly, the implementation of the present disclosure is not limited to the examples.

Figure 8:
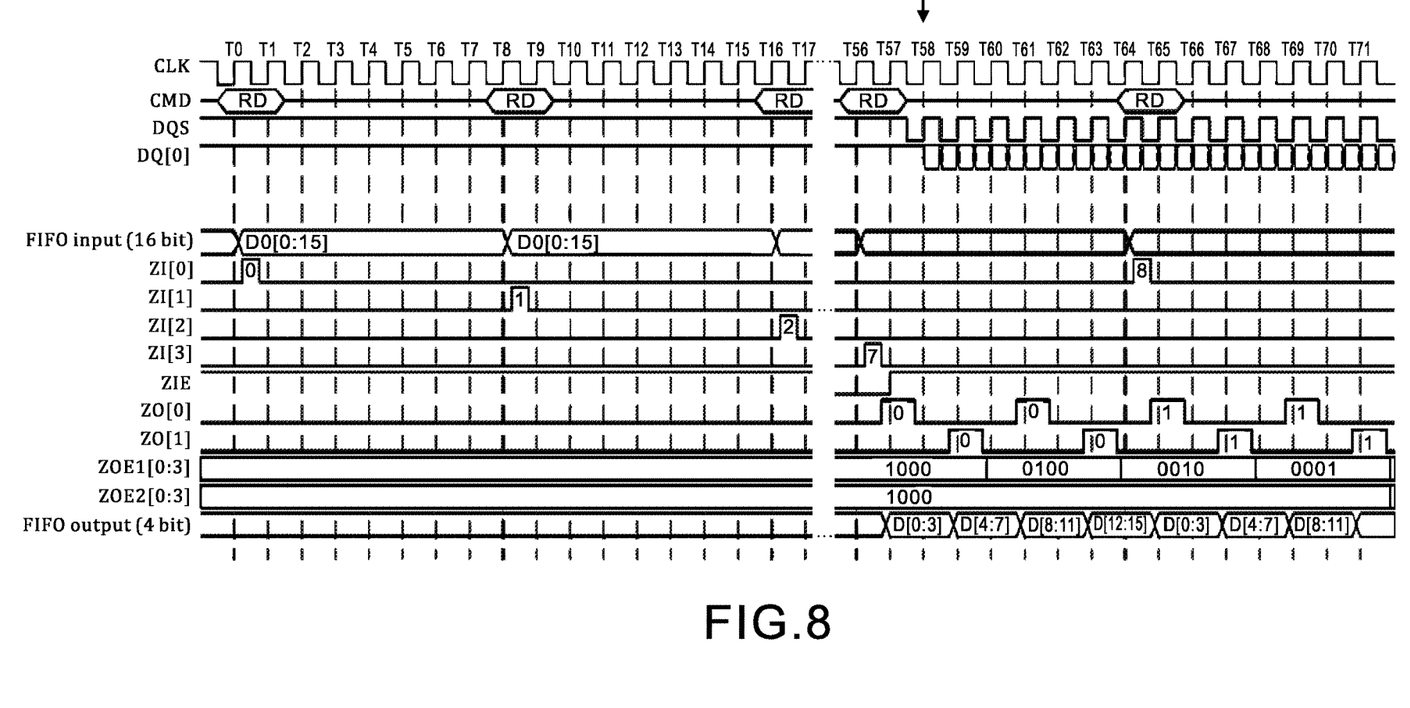
FIG. 8 is a schematic timing diagram illustrating operation of the data FIFO circuit of FIG. 7 according to an embodiment of the present disclosure.

Referring to FIG. 8, a schematic timing diagram illustrates operation of the data FIFO circuit of FIG. 7 according to an embodiment of the present disclosure. As compared to FIGS. 8 and 3, the operation of the FIFO input control for the data FIFO circuit of FIG. 7 is similar to that for the data FIFO circuit shown in FIGS. 2 and 3, and thus will not be detailed for the sake of brevity.

With respect to the data multiplexers 21A-24A and the output multiplexer 30A, the operation of the FIFO output control for the data FIFO circuit 3 of FIG. 7, as shown in FIG. 8, can be regarded as being similar to that for the data FIFO circuit shown in FIGS. 2 and 3, and thus will not be detailed for the sake of brevity.

Moreover, the operation of the FIFO output control for the data FIFO circuit 3 of FIG. 7, as shown in FIG. 8, differs from that for the data FIFO circuit shown 1 of FIG. 2 mainly in that data outputted from the output multiplexer 30A of the data FIFO circuit 3 are further inputted to the output multiplexer 35A and the output multiplexer 35A outputs a first portion (e.g., first 4-bit data of the 8-bit data; as indicated by D[0:3] in FIG. 8) and a second portion (e.g., second 4-bit data of the 8-bit data; as indicated by D[4:7] in FIG. 8) of the data in a sequential manner, in response to the control signals ZO[0] and ZO[1]. For example, referring to FIG. 8, when the output enabling signals ZOE2[0:3] indicate 1000 in binary, the output control signals ZOE1[0:3] indicate 1000 in binary, and the output control signals ZO[0]-ZO[1] are asserted sequentially (as indicated by the pulses of the output control signals ZO[0]-ZO[1] with "0" in FIG. 8), the first portion (e.g., represented by D[0:3] indicated for FIFO output in FIG. 8) and the second portion (e.g., represented by D[4:7] indicated for FIFO output in FIG. 8) of the data (e.g., 16-bit data) from the register R0A are outputted in a sequential manner via the output multiplexer 35A. For example, referring to FIG. 8, when the output enabling signals ZOE2[0:3] indicate 1000 in binary, the output control signals ZOE1[0:3] indicate 0100 in binary, and the output control signals ZO[0]-ZO[1] are asserted sequentially (as indicated by the pulses of the output control signals ZO[0]-ZO[1] with "0" in FIG. 8), the third portion (e.g., represented by D[8:11] indicated for FIFO output in FIG. 8) and the fourth portion (e.g., represented by D[12:15] indicated for FIFO output in FIG. 8) of the data (e.g., 16-bit data) from the register R0A are outputted in a sequential manner via the output multiplexer 35A. Likewise, the operations for outputting of the corresponding data from the registers R1A-R7A can then be performed similarly and will not be detailed for the sake of brevity.

Accordingly, in order to perform the operation of the FIFO output control for the data FIFO circuit of FIG. 7, for meeting the requirement of the CL=58 and AL=0, the data multiplexers (e.g., 21A-24A) can be controlled by the output enabling signal and the output control signals in a sequential manner so as to ensure that data can be outputted when the delay time of the CL for the corresponding read command elapses. As such, the structure of at least two stages of data multiplexing for data output makes the data FIFO circuit 3 suitable for being used in memory device applications of higher data rate, such as DDR5 or so on.

In this above embodiments, the application of the data FIFO circuit to FIFO circuitry for DDR-series SDRAM is exemplified. However, the implementation of the present disclosure is not limited thereto. The structure and operation of the data FIFO circuit, with respect to the control signals for FIFO input and output control, can be applied to the FIFO structure of other or new generation of DDR memory interface technology or any electronic device which employs data FIFO circuits.

The following provides examples for application of techniques of control signals for FIFO input and output control employed in the data FIFO circuit 1 or 3 for other latency counter scenario.

Figure 9:
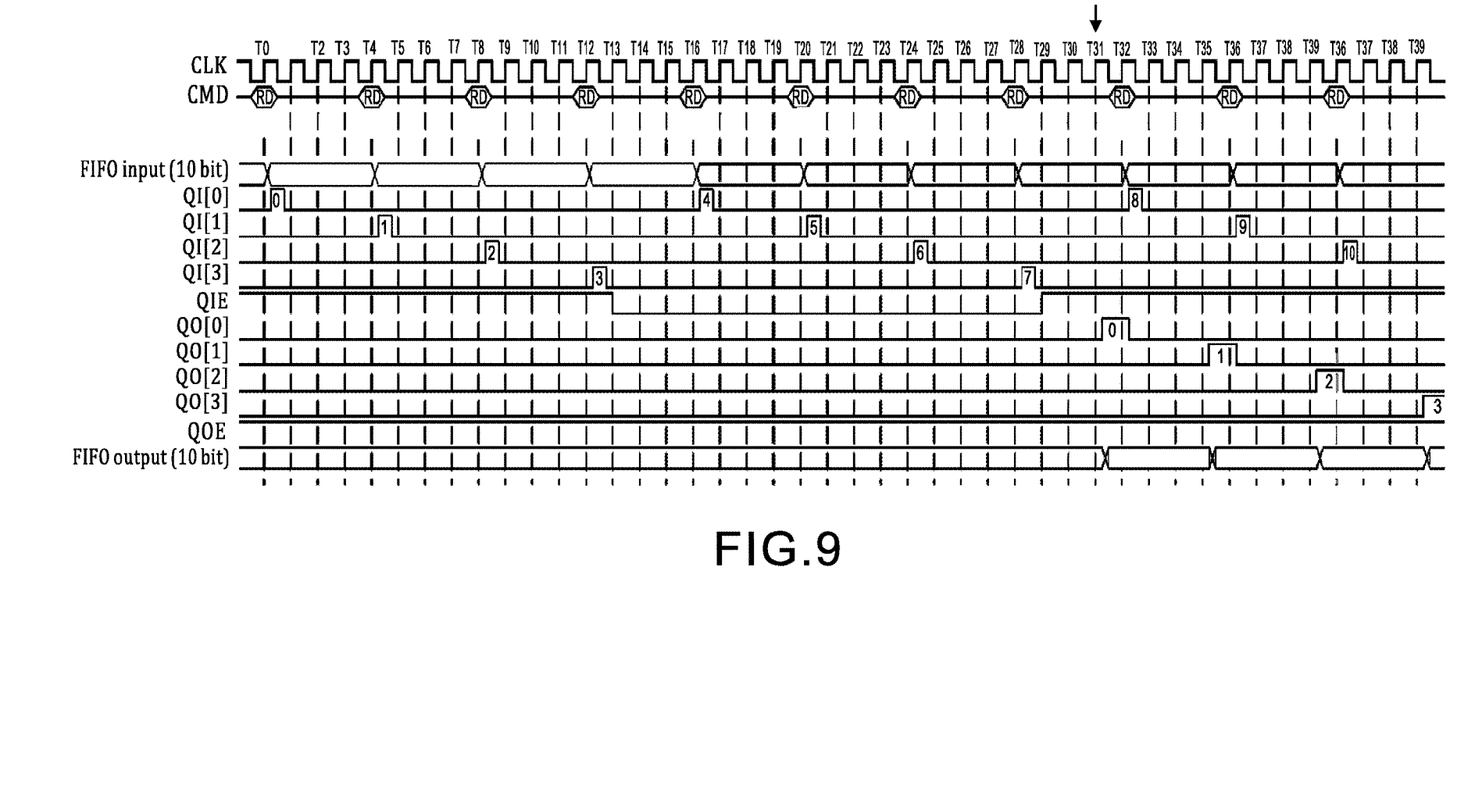
FIG. 9 is a schematic timing diagram illustrating FIFO operations according to an embodiment of the present disclosure.

Referring to FIG. 9, a schematic timing diagram illustrates FIFO operations according to an embodiment of the present disclosure. As shown in FIG. 9, the operation of the FIFO input control for a data FIFO circuit (not shown) to be designed is similar to that for the data FIFO circuit shown in FIGS. 2 and 7, and thus will not be detailed for the sake of brevity. In order to perform the operation of the FIFO output control for the data FIFO circuit according to the timing diagram shown in FIG. 9, for meeting the requirement of the AL=31 and CL=32, data multiplexers can be employed in the data FIFO circuit (not shown) to be designed and controlled by using an output enabling signal, indicated by QOE, and output control signals, indicated by QO[0]-QO [3], in a sequential manner so as to ensure that data (e.g., 10-bit data) can be outputted when the timing requirements of the AL and CL are met. As such, the data FIFO circuit (not shown) to be designed can adopt the structure of at least two stages of data multiplexing for data output so as to make the data FIFO circuit suitable for being used in memory device applications of higher data rate.

While the present disclosure has been described by way of specific embodiments, numerous modifications, combinations, and variations could be made thereto by those skilled in the art without departing from the scope and spirit of the present disclosure set forth in the claims.

What is claimed is:
1. A data first-in first-out (FIFO) circuit comprising:
   a register unit including:
      a plurality of decoders for outputting a plurality of decoded signals in response to a plurality of corresponding input control signals and at least one input enabling signal, and
      a plurality of N registers configured to receive input data in response to the corresponding decoded signals from the corresponding decoders;
   a plurality of data multiplexers, each coupled to M ones of the registers, wherein N and M are positive integers, N is equal to or greater than four, M is equal to or greater than two, and N is greater than M; and
   an output multiplexer, coupled to the data multiplexers, for providing a corresponding output from the data multiplexers sequentially.

2. The data FIFO circuit according to claim 1, wherein the N registers are configured to receive the input data sequentially in accordance with the corresponding decoded signals.

3. The data FIFO circuit according to claim 1, wherein each of the data multiplexers provides corresponding data to the output multiplexer in response to at least an output enabling signal and the output multiplexer provides the corresponding output from the data multiplexers in response to a plurality of corresponding output control signals.

4. The data FIFO circuit according to claim 1, wherein a first one of the data multiplexers is configured to receive a first portion of a corresponding output from a first register of the corresponding M ones.

5. The data FIFO circuit according to claim 4, wherein a second one of the data multiplexers is configured to receive a second portion of the corresponding output from the first register of the corresponding M ones.

6. The data FIFO circuit according to claim 5, wherein in response to at least one output enabling signal which indicates enabling of providing the corresponding output of the first register, the first and second ones of the data multiplexers provide the first portion and the second portion of the corresponding output respectively as two inputs to the output multiplexer.

7. The data FIFO circuit according to claim 6, wherein in response to a plurality of corresponding output control signals which indicate a selection of the first register, the output multiplexer provides the two inputs sequentially.

8. The data FIFO circuit according to claim 1, wherein the output multiplexer is a first output multiplexer and the data FIFO circuit further comprises:
   a second output multiplexer, coupled to the first output multiplexer, for selectively outputting a portion of the data outputted by the first output multiplexer.

9. The data FIFO circuit according to claim 1, wherein M is equal to or greater than four and each of the data multiplexers is coupled to the M ones of the registers.

10. The data FIFO circuit according to claim 1, wherein the data multiplexers include:
   a first multiplexer configured to receive a first portion of a corresponding output from a first register of the corresponding M ones;
   a second multiplexer configured to receive a second portion of the corresponding output from the first register of the corresponding M ones;
   a third multiplexer configured to receive a first portion of a corresponding output from a second register of the corresponding M ones;
   a fourth multiplexer configured to receive a second portion of the corresponding output from the second register of the corresponding M ones;
   wherein the output multiplexer is configured to receive outputs from the data multiplexers and outputting data from one of the data multiplexers sequentially.

11. The data FIFO circuit according to claim 10, wherein in response to at least one output enabling signal which indicates enabling of providing the corresponding outputs of the first and second registers, the first to fourth multiplexers provide the first portion and the second portion of the corresponding output from the first register and the first portion and the second portion of the corresponding output from the second register, respectively, as inputs to the output multiplexer.

12. The data FIFO circuit according to claim 11, wherein in response to a plurality of corresponding output control signals which indicate a selection of the first and second registers, the output multiplexer provides the inputs sequentially.

13. The data FIFO circuit according to claim 10, wherein:
the first multiplexer is further configured to receive a first portion of a corresponding output from a third register of the corresponding M ones;
the second multiplexer is further configured to receive a second portion of the corresponding output from the third register of the corresponding M ones;
the third multiplexer is further configured to receive a first portion of a corresponding output from a fourth register of the corresponding M ones;
the fourth multiplexer is further configured to receive a second portion of the corresponding output from the fourth register of the corresponding M ones; and
wherein the output multiplexer is configured to receive outputs from the data multiplexers and outputting data from one of the data multiplexers sequentially.

14. The data FIFO circuit according to claim 13, wherein in response to at least one output enabling signal which indicates enabling of providing the corresponding outputs of the third and fourth registers, the first to fourth multiplexers provide the first portion and the second portion of the corresponding output from the third register and the first portion and the second portion of the corresponding output from the fourth register, respectively, as inputs to the output multiplexer.

15. The data FIFO circuit according to claim 14, wherein in response to a plurality of corresponding output control signals which indicate a selection of the third and fourth registers, the output multiplexer provides the inputs sequentially.

* * * * *